US011789137B2

(12) United States Patent
Subburaj et al.

(10) Patent No.: US 11,789,137 B2
(45) Date of Patent: Oct. 17, 2023

(54) FMCW CHIRP BANDWIDTH CONTROL

(71) Applicant: Texas Instruments Incorporated, Dallas, TX (US)

(72) Inventors: Karthik Subburaj, Karnataka (IN); Sreekiran Samala, Plano, TX (US); Indu Prathapan, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 205 days.

(21) Appl. No.: 17/138,549

(22) Filed: Dec. 30, 2020

(65) Prior Publication Data

US 2022/0206133 A1 Jun. 30, 2022

(51) Int. Cl.
*H03L 7/099* (2006.01)
*H03L 7/087* (2006.01)
*G01S 13/34* (2006.01)
*G01S 7/03* (2006.01)
*H03C 3/09* (2006.01)
*G01S 7/35* (2006.01)

(52) U.S. Cl.
CPC ............ *G01S 13/345* (2013.01); *G01S 7/032* (2013.01); *G01S 7/352* (2013.01); *H03C 3/0925* (2013.01); *H03L 7/087* (2013.01); *H03L 7/099* (2013.01)

(58) Field of Classification Search
CPC ........ G01S 13/343; G01S 13/34; G01S 13/32; G01S 13/06; G01S 13/02; G01S 13/00; H03C 3/0925; H03C 3/0916; H03C 3/0908; H03C 3/09; H03C 3/02; H03C 3/00; H03C 3/0941; H03C 3/095; H03C 3/0966; H03C 3/0975; H03L 7/093; H03L 7/085; H03L 7/08; H03L 7/00; H03L 7/06

See application file for complete search history.

(56) References Cited

U.S. PATENT DOCUMENTS 8,731,502 B2 5/2014 Salle et al.
9,696,359 B2 7/2017 Subburaj et al.
(Continued)

FOREIGN PATENT DOCUMENTS

JP 2014062824 A 4/2014

OTHER PUBLICATIONS

International Search Report, International Patent Application No. PCT/US2021/065267, dated Apr. 19, 2022, 10 pages.

*Primary Examiner* — Diana J. Cheng
(74) *Attorney, Agent, or Firm* — Michael T. Gabrik; Frank D. Cimino

(57) ABSTRACT

In described examples, a frequency modulated continuous wave (FMCW) synthesizer includes a control engine, and a phase locked loop (PLL) including a frequency divider, a control voltage generator (CVG), and a voltage controlled oscillator (VCO). The frequency divider modifies a VCO output frequency based on a control input. The CVG generates a control voltage based on a frequency reference and the frequency divider output. The VCO outputs a FMCW output having the VCO output frequency in response to the control voltage. The control engine generates the control input so that the VCO output frequency: from a first time to a second time, is a first frequency; from the second time to a third time, changes at a first rate; from the third time to a fourth time, changes at a second rate different from the first rate; and from the fourth time to a fifth time, is a second frequency.

23 Claims, 6 Drawing Sheets

(56) References Cited

U.S. PATENT DOCUMENTS

| | | | |
|---|---|---|---|
| 10,067,221 B2* | 9/2018 | Ginsburg | G01S 13/931 |
| 11,228,318 B1* | 1/2022 | Saric | G01S 13/343 |
| 2018/0113196 A1 | 4/2018 | Subburaj et al. | |
| 2019/0377076 A1 | 12/2019 | Vigier et al. | |

* cited by examiner

FMCW CHIRP BANDWIDTH CONTROL

TECHNICAL FIELD

This application relates generally to frequency modulated continuous wave (FMCW) radar, and more particularly to accurate generation of FMCW chirp waveforms.

BACKGROUND

A prior art fast FMCW radar system includes a FMCW synthesizer that generates chirp signals that are processed (for example, phase shifted and amplified) and then are transmitted. If the FMCW radar system receives reflections of the transmitted chirp signal from an object, the system can process those signals and determine distance, velocity, and range to the object. Each chirp signal slews up or down in frequency over a fixed period of time.

FIG. 1 shows an example illustration of a prior art FMCW signal 100 produced by a prior art FMCW synthesizer, with frequency in the vertical axis and time in the horizontal axis. FIG. 1 also shows a corresponding control timing chart 102 with control signals in the vertical axis and time in the horizontal axis. The control timing chart 102 shows multiple control signals 104 (also called control words), with start pulses to initiate action on corresponding control signals 104 represented as vertical lines that occur at various times ($t_0$, $t_1$, etc.). Each control signal 104 has a corresponding number pair that includes a starting frequency ($F_0$ in each of the example control signals 204 in FIG. 1) and a slope for production of subsequent chirp frequencies (0 or $s_1$ in the example control signals 104 in FIG. 1). Slopes correspond to a change in frequency per unit of time, for example, $\Delta Hz/s$.

Interval $t_0$ to $t_1$ is an idle time 106, a period during which no FMCW chirp is transmitted. This idle time is instigated at time $t_0$ when a control signal 104 ($F_0$, 0) causes the FMCW synthesizer to produce a frequency $F_0$ with slope zero, generating a constant tone with frequency $F_0$ 110. Time $t_1$ to $t_2$ corresponds to production and transmission of a FMCW chirp 108. At time $t_1$, the control signal 104 ($F_0$, $s_1$) instructs the FMCW synthesizer 108 to start at frequency $F_0$, and to slew the output frequency 112 higher with slope $s_1$, generating the FMCW chirp 108. At time $t_2$, the FMCW chirp 108 has reached frequency $F_1$ (a maximum frequency 114 of the FMCW chirp 208). The maximum frequency 114 of the FMCW chirp 108 $F_1$ corresponds to the starting frequency $F_0$, plus the slope of the FMCW chirp 108 multiplied by the duration of the FMCW chirp 108, which can be represented as $F_1 = F_0 + s_1*(t_2-t_1)$.

Interval $t_2$ to $t_3$ corresponds to an idle time 106. The control signal 104 ($F_0$, 0) at time $t_2$ causes the FMCW synthesizer to attempt to change its output directly to frequency $F_0$, with an intended waveform 116 that would result in a traditional sawtooth pattern. However, this disjunctive change in frequencies can result in an actual waveform 118 that includes an unintended overshoot 120 beyond the targeted new start frequency $F_0$. The overshoot can result in additional settling time before the FMCW signal 100 stabilizes and prior to enabling production of a next FMCW chirp 108. Reduced FMCW chirp 108 rate reduces the number of data samples that can be collected, reducing FMCW radar system accuracy. Some FMCW radars do not collect radar data samples during the settling time, or do not use data samples collected during the settling time to determine target presence, range, and velocity.

In some examples, FMCW radar systems operate within an allocated bandwidth, and a frequency overshoot 120 can cause a FMCW signal to exceed the allocated bandwidth. In some examples, $F_0$ and $F_1$ are selected so that any overshoot 120 remains within the allocated bandwidth. However, this can reduce FMCW radar system accuracy, because the FMCW radar system accuracy is proportional to the bandwidth of transmitted FMCW chirps 108. In some examples, the radar system power amplifier is turned off to prevent transmission during idle times 106. However, this can result in additional resettling time in the FMCW radar system receiver, as it transitions between not receiving a signal and receiving a signal; receiver accuracy can be reduced during resettling. Turning the RMCW radar system power amplifier 118 off and on can also result in additional resettling time in the FMCW synthesizer, as power amplifier state transitions pull the frequency generated by the FMCW synthesizer.

SUMMARY

In described examples, a frequency modulated continuous wave (FMCW) synthesizer includes a control engine, and a phase locked loop (PLL) including a frequency divider, a control voltage generator (CVG), and a voltage controlled oscillator (VCO). The frequency divider modifies a VCO output frequency based on a control input. The CVG generates a control voltage based on a frequency reference and the frequency divider output. The VCO outputs a FMCW output having the VCO output frequency in response to the control voltage. The control engine generates the control input so that the VCO output frequency: from a first time to a second time, is a first frequency; from the second time to a third time, changes at a first rate; from the third time to a fourth time, changes at a second rate different from the first rate; and from the fourth time to a fifth time, is a second frequency.

DETAILED DESCRIPTION

Figure 1:
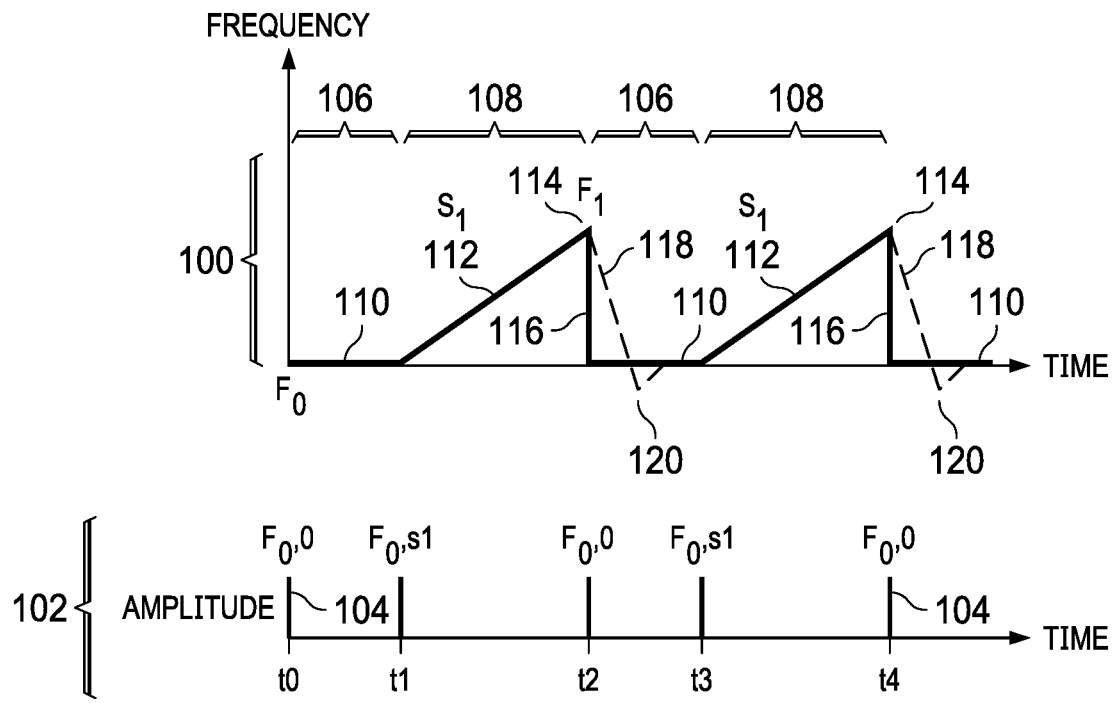
FIG. 1 shows an example illustration of a FMCW signal produced by a prior art FMCW synthesizer, and a corresponding control timing chart.
Figure 2:
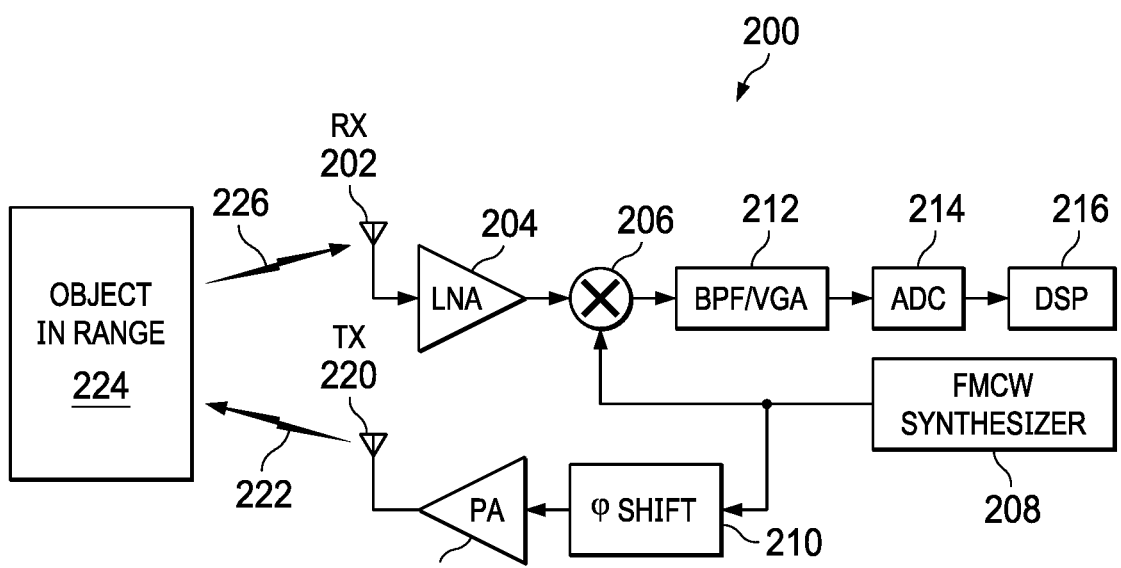
FIG. 2 shows an example functional block layout of a FMCW radar system.

FIG. 2 shows an example functional block layout of a prior art FMCW radar system 200 which has certain attributes known in the art, but as a system is further improved by teachings of this document. The system 200 includes a receiver (RX) 202 that receives signals and outputs them to a low noise amplifier (LNA) 204. The receiver 202 can include multiple receiver sensors to enable determination of information such as distance, velocity, and range. The LNA 204 outputs to a mixer 206. A FMCW synthesizer 208 generates FMCW chirps to be transmitted (such as for object detection and range finding). The FMCW synthesizer 208 outputs the FMCW chirps to the mixer 206 and to a phase shift block 210. The mixer 206 mixes the amplified received signal from the LNA 204 and the chirps from the FMCW synthesizer 208, and outputs to a band pass filter/variable gain amplifier (BPF/VGA) 212. The BPF/VGA 212 outputs to an analog-to-digital converter (ADC) 214, which outputs to a digital signal processor (DSP) 216 or other analysis component. The phase shift block 210 outputs phase shifted FMCW chirps to a power amplifier (PA) 118, which outputs to a transmitter (TX) 220.

In the FIG. 2 system 200, the transmitter 220 transmits amplified, phase shifted FMCW chirps 222, which can be reflected from an object in range 224 of the transmitted FMCW chirps 222. (The range of a FMCW radar, such as FMCW radar system 200, is dependent on, for example, the modulation frequency of the transmitted signal, the frequency change per unit time—the "slope" or "slew"—of chirps in the transmitted signal, the bandwidth of the BPF, and the ADC sampling rate.) The reflected FMCW signal 224 is then received by the receiver 202. The DSP 216 can be used to determine information about the object in range 224 such as distance, direction, and velocity.

Figure 3:
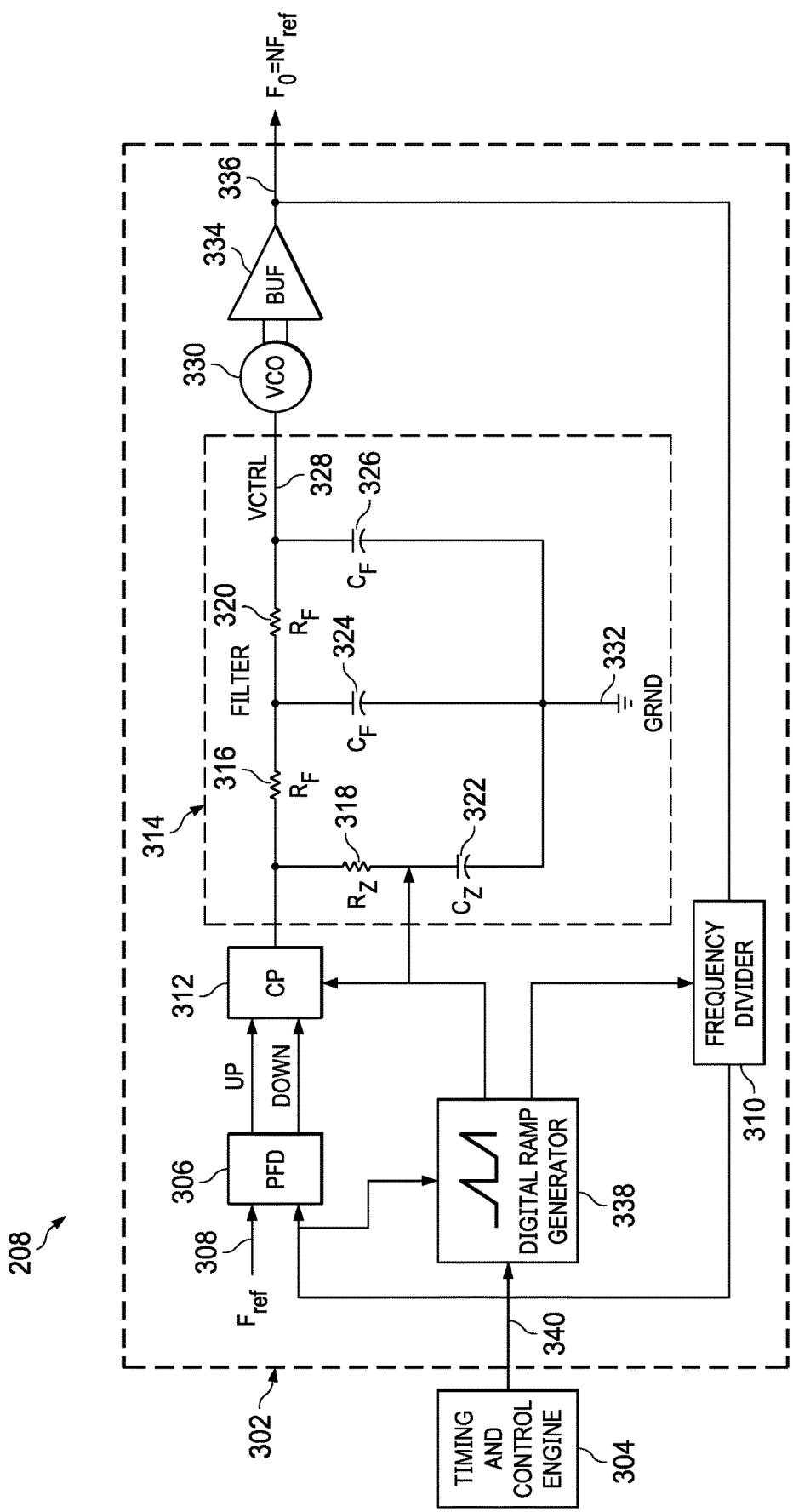
FIG. 3 shows an example functional block layout of the FIG. 2 FMCW synthesizer.

FIG. 3 shows an example functional block layout of the FIG. 2 FMCW synthesizer 208. The FMCW synthesizer 208 includes a phase locked loop (PLL) 302, and a timing and control engine 304. In the PLL 302, a phase frequency detector (PFD) 306 receives as inputs a frequency reference 308 at a reference frequency $F_{ref}$, as well as the output of a frequency divider 310. The PFD 306 outputs UP and DN (down) control signals to a charge pump (CP) 312. The CP 312 outputs a control signal to a filter 314, which produces a filtered control signal VCTRL 328.

The filter 314 includes a first resistor 316 with a first resistance $R_F$, a second resistor 318 with a second resistance $R_Z$, a third resistor 320 with a third resistance $R_F$, a first capacitor 322 with a first capacitance $C_Z$, a second capacitor 324 with a second capacitance $C_F$, and a third capacitor 326 with a third capacitance $C_F$. The charge pump 312 output is connected to a first pole of the first resistor 316 and a first pole of the second resistor 318. A second pole of the second resistor 318 is connected to a first plate of the first capacitor 322. A second pole of the first resistor 316 is connected to a first pole of the third resistor 320 and a first plate of the second capacitor 324. A second pole of the third resistor is connected to output the filtered control signal VCTRL 328 from the filter 314 to a voltage controlled oscillator (VCO) 330, and is also connected to a first plate of the third capacitor 326. A reference node 332 at a reference voltage GRND, such as a ground voltage, is connected to a second plate of the first capacitor 322, a second plate of the second capacitor 324, and a second plate of the third capacitor 326.

The VCO 330 outputs to a buffer (BUF) 334, which outputs a FMCW output signal 336 with frequency $F_0$ from the FMCW synthesizer 208. The buffer 334 also outputs the FMCW output signal 336 to a frequency divider 310. The frequency divider 310 outputs to the PFD 306 (as stated above), and to a digital ramp generator 338. The digital ramp generator 338 is connected to receive timing and control signals 340 from the timing and control engine 304. The timing and control signals 340 can include, for example, start frequency, slope, and a start pulse (to start execution based on the start frequency and slope). The timing and control engine 304 can be a low speed timing and control engine. The timing and control engine 304 also can be clocked by a clock (not shown) that is in a fixed frequency relation to the reference frequency $F_{ref}$. For example, the timing and control engine 304 can be clocked by a 40 MHz clock, while $F_{ref}$ equals 900 MHz.

The digital ramp generator 338 is connected to output control signals to the frequency divider 310, the CP 312, and the filter 314. The connection from the digital ramp generator 338 to the CP 312 and the filter 314 is shown as a single line for clarity, but can correspond to distinct signals transmitted over separate lines.

The frequency divider 310 divides the FMCW output signal 336 by a number N, and outputs the resulting signal with frequency $F_0/N$. The PFD 306 compares the reference frequency $F_{ref}$ and the frequency divider output frequency $F_0/N$, and outputs the UP and DN control signals to make the two frequencies equal. Accordingly, $F_0=N*F_{ref}$. The digital ramp generator 338 outputs a signal to the frequency divider 310 that controls the frequency of FMCW output signal 336 by controlling the value of N. The control signals output by the frequency divider 310 to the charge pump 312 and the filter 314 are described further with respect to FIGS. 4 and 5.

Figure 4:
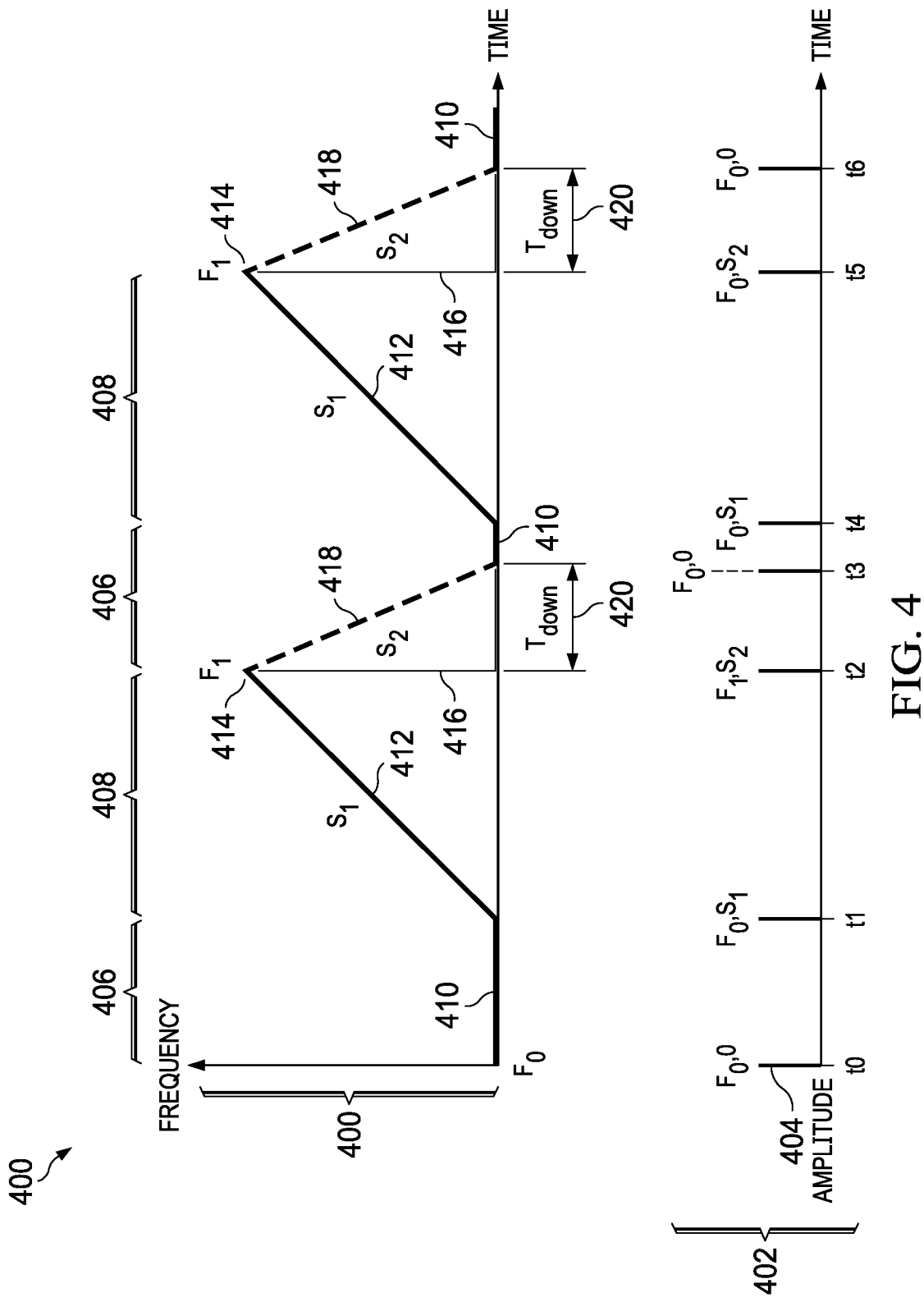
FIG. 4 shows an example illustration of a FMCW signal produced by the FMCW synthesizer of FIG. 3, and a corresponding control timing chart.

FIG. 4 shows an example illustration of a FMCW signal 400 produced by the FMCW synthesizer 208 of FIG. 3, and a corresponding control timing chart 402. The control timing chart 402 shows multiple control signals 404 (also called control words), with start pulses to initiate action on corresponding control signals 404 represented as vertical lines that occur at various times ($t_0$, $t_1$, etc.). Control signals 404 are generated by the timing and control engine 304, and the digital ramp generator 338 uses the control signals 404 to control the frequency divider 310. The frequency divider 310 adjusts N, in response to control by the digital ramp generator 338, to accordingly change the FMCW signal 400 (corresponding to FMCW output signal 336). As explained above, the FMCW output frequency equals $N*F_{ref}$. Each control signal 404 has a corresponding number pair that includes a starting frequency ($F_0$ or $F_1$ in the example control signals 404 in FIG. 4) and a slope for production of subsequent chirp frequencies (0, $s_1$, or $s_2$ in the example control signals 404 in FIG. 4). Slopes correspond to a change in frequency per unit of time, for example, $\Delta Hz/s$.

Interval $t_0$ to $t_1$ is an idle time 406, a period during which no FMCW chirp is transmitted. At time $t_0$ a control signal 404 ($F_0$, 0) causes the FMCW synthesizer 208 to produce a frequency $F_0$ with slope zero, generating a constant tone with frequency $F_0$ 410. Time $t_1$ to $t_2$ corresponds to production and transmission of a FMCW chirp 408. At time $t_1$, the control signal 404 ($F_0$, $s_1$) instructs the FMCW synthesizer 208 to start at frequency $F_0$, and to slew the output frequency 412 higher with slope $s_1$, generating the FMCW chirp 408. At time $t_2$, the FMCW chirp 408 has reached frequency $F_1$ (a maximum frequency 414 of the FMCW chirp 408). The maximum frequency 414 of the FMCW chirp 408 $F_1$ corresponds to the starting frequency $F_0$, plus the slope of the FMCW chirp 408 multiplied by the duration of the FMCW chirp 408, which can be represented as $F_1=F_0+s_1*(t_2-t_1)$.

The timing and control engine 304 can calculate $F_1$ as shown, and can calculate $s_2$ based on $F_1$, $F_0$, and a ramp-down period $T_{down}$ 420, where $T_{down}$ is a time period for the FMCW chirp 408 to slew downward from its maximum frequency 414 to $F_0$. Accordingly, $T_{down}$ 420 can be selected. For example, $T_{down}$ 420 can be selected, and $s_2$ can be calculated based on $F_0$, $F_1$, and $T_{down}$, to avoid cycle slips: $s_2=(F_0-F_1)/T_{down}$. A cycle slip is a slip by a cycle with respect to the frequency reference 308, and corresponds to loss of phase lock in the PLL 302. A cycle slip can be caused by a higher slope $s_2$ than the PLL 302 can tolerate.

Interval $t_2$ to $t_4$ corresponds to an idle time 406. An ideal sawtooth pattern would include a zero time return 416 to chirp start frequency $F_0$. However, to avoid an overshoot when returning to chirp start frequency $F_0$, the control signal 404 ($F_1$, $s_2$) at time $t_2$ causes the FMCW synthesizer 208 to, starting at frequency $F_1$, slew the output frequency 418 lower with linear slope $s_2$. This returns the output frequency to chirp start frequency $F_0$ over a controlled time period $T_{down}$ 420, the time interval from $t_2$ to $t_3$. For example, $s_1$ can be 100 MHz per microsecond, and $s_2$ can be 1000 MHz per microsecond to enable a higher FMCW chirp 408 repeat frequency, and accordingly, a shorter period for repetition of the FMCW chirp waveform. The FMCW chirp waveform corresponds to the idle time 406 plus the FMCW chirp 408. Accordingly, the repetition period of the FMCW chirp waveform corresponds to the periods from $t_0$ to $t_2$, and from $t_2$ to $t_5$ (respectively, two separate FMCW chirp 408 periods. Repetition frequency is the reciprocal of the repetition period.

The FMCW signal 400 of FIG. 4 is an example showing a sawtooth-like signal. It is also contemplated that reverse sawtooth-like FMCW signals can be used, and that such reverse-sawtooth like signals can also correspond to the FMCW signal 400, but with time ordering of control signals 404 reversed. Accordingly, a FMCW signal 400 can be produced as shown in FIG. 4, in which time intervals corresponding to signal output generated in response to control signals run from $t_0$ to $t_1$, from $t_1$ to $t_2$, from $t_2$ to $t_3$, from $t_3$ to $t_4$, from $t_4$ to $t_5$, and from $t_5$ to $t_6$; or vice versa: corresponding to time intervals running from $t_6$ to $t_5$, from $t_5$ to $t_4$, from $t_4$ to $t_3$, from $t_3$ to $t_2$, from $t_2$ to $t_1$, and from $t_1$ to $t_0$.

To shorten the time interval $t_2$ to $t_3$, which is equivalent to increasing the absolute value of steepness of the slope $s_2$, the FIG. 3 digital ramp generator 338 can control the CP 312 to output increased current to the filter 314. For example, current fed to the filter 314 can be increased by increasing the current fed to the charge pump 312 to a value higher than used during the time interval $t_1$ to $t_2$. This enables the VCO 330 and the PLL 302 to accurately change output frequency more rapidly without the PLL 302 losing lock, accordingly, without resulting in cycle slips.

To shorten the time interval $t_2$ to $t_3$, the digital ramp generator 338 can also control one or more of the resistors 316, 318, 320 or capacitors 322, 324, 326 of the filter 314 to increase the bandwidth of the filter 314 to increase filter 314 reaction rate and increase the rate of change of VCTRL 328. The filter 314 bandwidth can be increased to, for example, ten times the bandwidth used during generation of a FMCW chirp 408. Accordingly, the digital ramp generator 338 can control one, some, or all of $R_F$, $R_Z$, $C_F$, and $C_Z$ (some or all of which impedances can be programmable) to change the bandwidth of the filter 314. Increasing the filter 314 bandwidth increases the phase noise in the FMCW synthesizer output 336, but enables faster resettling of the FMCW synthesizer output 336 to the chirp start frequency $F_0$. Conversely, lowering the filter 314 bandwidth reduces phase noise in the FMCW synthesizer output 336. Accordingly, the filter 314 bandwidth can be reduced after the frequency ramp-down period ($T_{down}$ 420, which corresponds to interval $t_2$ to $t_3$, and interval $t_5$ to $t_6$ in respective ramp-down periods shown in FIG. 4). The filter 314 bandwidth can be reduced during the remainder of the idle time 406 and during FMCW chirps 408 to reduce phase noise in the FMCW synthesizer output 336.

In some examples, the idle time 406 can be considered "wasted" time, when the FIG. 2 ADC 214 is not sampling data for analysis. The FIG. 2 ADC 214 samples data (accordingly, data is received by the RX 202) during FMCW chirps 408. Increased filter noise from increased filter 314 bandwidth can be tolerated during $T_{down}$ 420 to reduce the idle time 406.

$S_2$, the increased current of the CP 312, and the increased bandwidth of the filter 314 are selected to keep the PLL 302 in lock during the idle times 406, including during $T_{down}$ 420, increasing accuracy of VCO 330 frequency control and avoiding frequency overshoot. $S_2$, the increased current of the CP 312, and the increased bandwidth of the filter 314 can also be selected to shorten the time interval $t_2$ to $t_3$, accordingly, the time to transition from frequency $F_1$ to frequency $F_0$.

Figure 5:
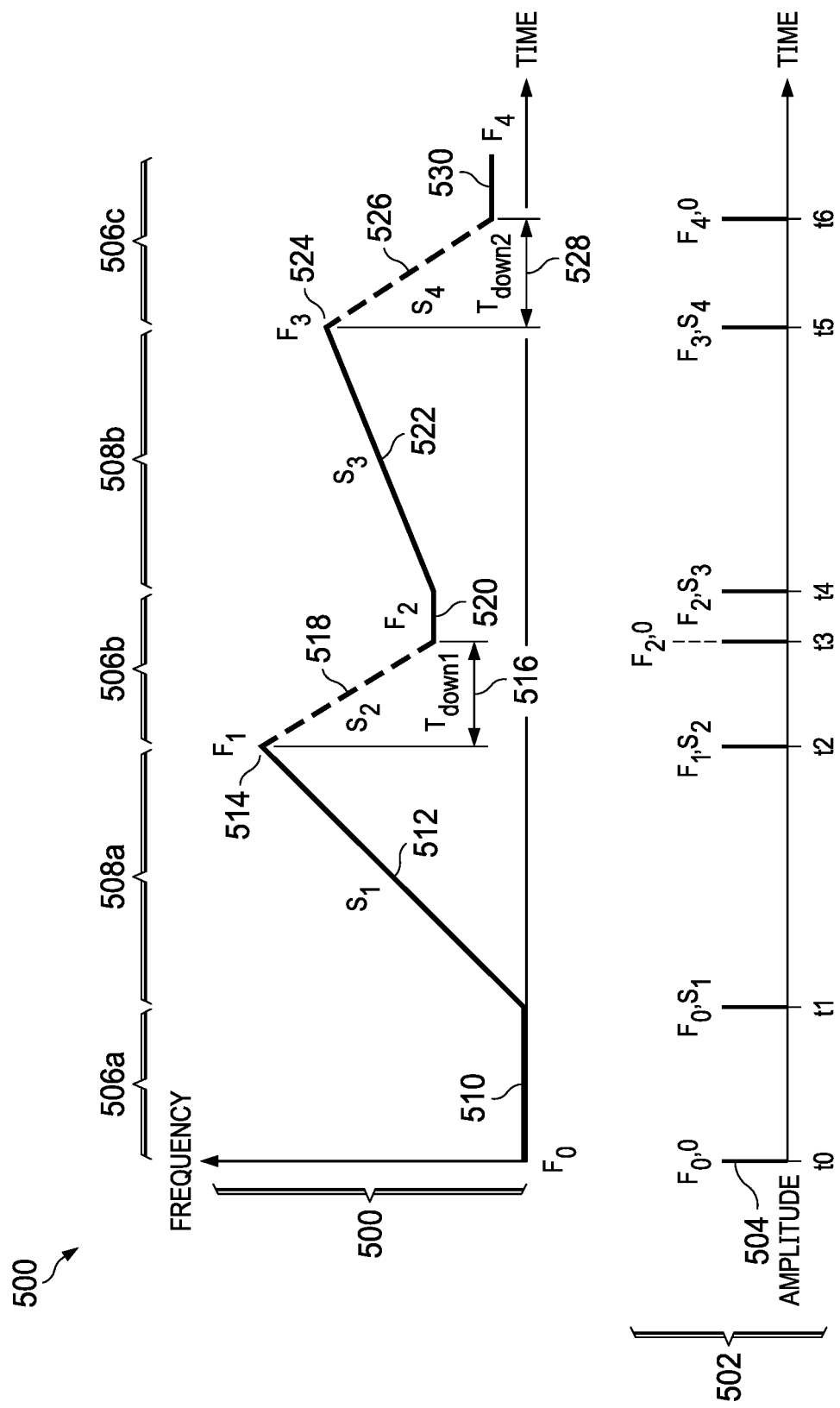
FIG. 5 shows an example illustration of a FMCW signal produced by the FMCW synthesizer of FIG. 3, and a corresponding control timing chart.

FIG. 5 shows an example illustration of a FMCW signal 500 produced by the FIG. 3 FMCW synthesizer 208, and a corresponding control timing chart 502. The FMCW signal 500 is produced similarly to the FIG. 4 FMCW signal 400. However, the FIG. 5 FMCW signal 500 shows that the FIG. 3 FMCW synthesizer 208 can produce a FMCW output signal 336 without overshoots that includes FMCW chirps 508a, 508b starting at multiple different frequencies (for example, $F_0$, $F_2$) and ending at multiple different frequencies (for example, $F_1$, $F_3$) with multiple different corresponding slopes (for example, $s_1$ and $s_3$ during FMCW chirps 508a, 508b, and $s_2$ and $s_4$ during ramp-down periods $T_{down1}$ 516 and $T_{down2}$ 528).

Interval $t_0$ to $t_1$ is a first idle time 506a. At time $t_0$, the timing and control engine 304 sends a control signal 504 instructing the PLL 302 to produce FMCW synthesizer output 336 with constant frequency 510 $F_0$ (starting frequency $F_0$ with slope zero).

Interval $t_1$ to $t_2$ is a first FMCW chirp 508a. At time $t_1$, the FIG. 3 PLL 302 is instructed to slew the output frequency 512 starting with frequency $F_0$, and increasing with slope $s_1$. At time $t_2$, the FMCW chirp 508a reaches a maximum frequency 514, $F_1$. As discussed above with respect to FIG. 4, the timing and control engine 304 can calculate $F_1$ using $F_0$, $t_1$, and $t_2$.

Interval $t_2$ to $t_4$ is a second idle time 506b. Interval $t_2$ to $t_3$ is a first ramp-down 518 over a ramp-down period $T_{down1}$ 516. During interval $t_2$ to $t_3$, the FMCW synthesizer output frequency is ramped down 518 from frequency $F_1$ to frequency $F_2$ with slope $s_2$. As discussed above with respect to FIG. 4, the timing and control engine 304 controls the CP 312 to increase its output current, and controls the filter 314 to increase its bandwidth, so that the slope $s_2$ of the ramp-down 518 can be steeper than the slope $s_1$, shortening $T_{down1}$ 516. Also, the slope $s_2$ can be calculated based on $F_1$, $F_2$, and $T_{down1}$ 516: $s_2=(F_2-/T_{down1}$. At time $t_3$, the FMCW synthesizer output 336 is set to constant frequency 520 $F_2$, accordingly, frequency $F_2$ with slope zero.

Interval $t_4$ to $t_5$ is a second FMCW chirp 508b. At time $t_4$, the PLL 302 is instructed to slew the output frequency 522 starting with frequency $F_2$, and increasing with slope $s_3$. At time $t_5$, the FMCW chirp 508b reaches a maximum frequency 524, $F_3$. As discussed above with respect to FIG. 4, the timing and control engine 304 can calculate $F_3$ using $F_2$, $t_4$, and $t_5$.

Time $t_5$ is the beginning of a third idle time 506c (the end of the third idle time 506c, corresponding to the beginning of a third FMCW chirp, is not shown). Interval $t_5$ to $t_6$ is a second ramp-down 526 over a duration $T_{down2}$ 528. During interval $t_5$ to $t_6$, the FMCW synthesizer output frequency is ramped down 526 from frequency $F_3$ to frequency $F_4$ with slope $s_4$. As discussed above with respect to FIG. 4, the timing and control engine 304 controls the CP 312 to increase its output current, and controls the filter 314 to increase its bandwidth, so that the slope $s_4$ of the ramp-down 526 can be steeper than the slope $s_3$, shortening $T_{down2}$ 528. Also, the slope $s_4$ can be calculated based on $F_3$, $F_4$, and $T_{down2}$ 516: $s_4 = (F_4 - F_3)/T_{down2}$. At time $t_6$, the FMCW synthesizer output 336 is set to constant frequency 530 $F_4$, accordingly, frequency $F_4$ with slope zero.

Figure 6:
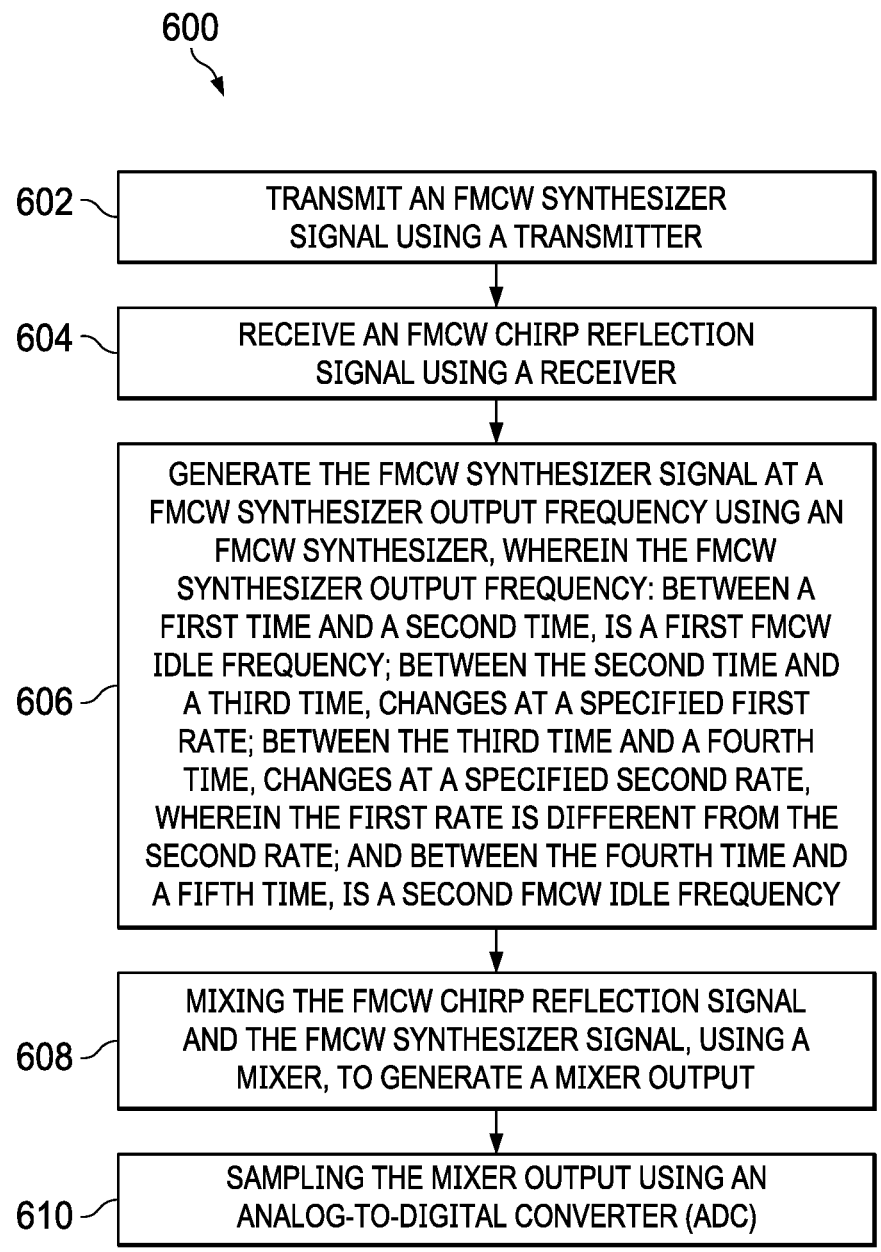
FIG. 6 shows an example of a process for generating a FMCW signal.

FIG. 6 shows an example process 600 for operating the FIG. 2 FMCW radar system 200. In step 602, the TX 220 transmits a FMCW synthesizer signal. In step 604, the RX 202 receives a FMCW chirp reflection signal 226. In step 606, the FMCW synthesizer 208 generates the FMCW synthesizer signal at a FMCW synthesizer output frequency, wherein the FMCW synthesizer output frequency: between a first time and a second time, is a first FMCW idle frequency; between the second time and a third time, changes at a specified first rate; between the third time and a fourth time, changes at a specified second rate, wherein the first rate is different from the second rate; and between the fourth time and a fifth time, is a second FMCW idle frequency. In step 608, the mixer 206 mixes the FMCW chirp reflection signal and the FMCW synthesizer signal to generate a mixer output. In step 610, the ADC 214 samples the mixer output.

Figure 7:
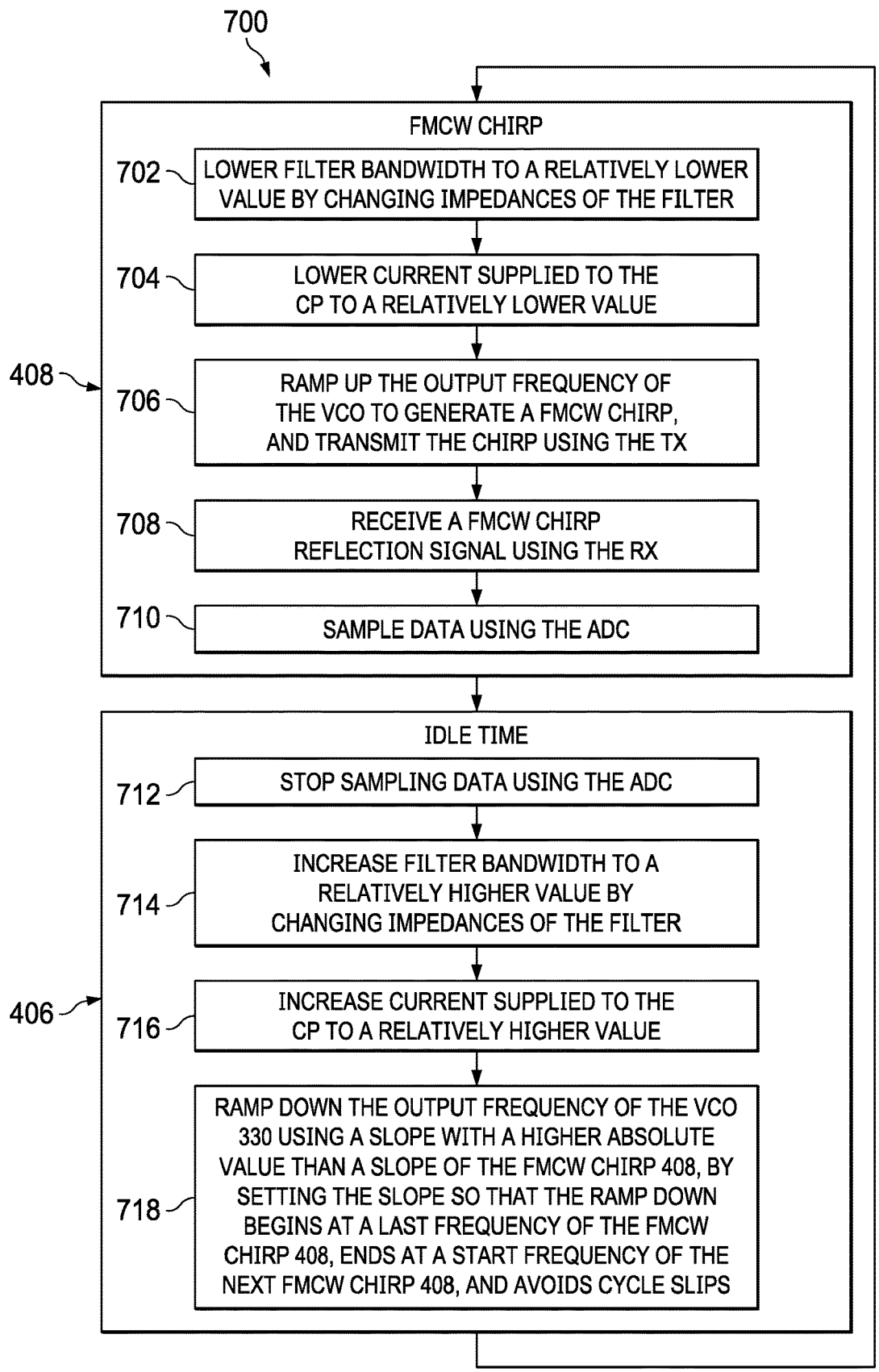
FIG. 7 shows an example process 700 for operating the FIG. 2 FMCW radar system 200 including the FMCW synthesizer 208 of FIG. 3.

FIG. 7 shows an example process 700 for operating the FIG. 2 FMCW radar system 200 including the FMCW synthesizer 208 of FIG. 3. To generate an FMCW chirp 408, a digital state machine (not shown) controls the ADC 214, TX 202, RX 220, and FMCW synthesizer 208 to operate synchronously, as follows. In step 702, the filter 314 bandwidth is changed to a relatively lower value by changing impedances of the filter 314. In step 704, the current supplied to the CP 312 is changed to a relatively lower value. In step 706, the output frequency of the VCO 330 is ramped up to generate a FMCW chirp 408, and the FMCW chirp is transmitted using the TX 220. In step 708, the FMCW chirp reflection signal 226 is received using the RX 202. In step 710, data is sampled using the ADC 214.

During a time between FMCW chirps 408, the digital state machine controls the ADC 214 and the FMCW synthesizer 208, as follows. In step 712, the ADC 214 stops sampling data. In step 714, the filter 314 bandwidth is increased to a relatively higher value by changing impedances of the filter 314. In step 716, current supplied to the CP 312 is increased to a relatively higher value. In step 718, the output frequency of the VCO 330 is ramped down using a slope with a higher absolute value than a slope of the FMCW chirp 408, by setting the slope so that the ramp down begins at a last frequency of the FMCW chirp 408, ends at a start frequency of the next FMCW chirp 408, and avoids cycle slips. The process 700 can then repeat from step 702.

Modifications are possible in the described embodiments, and other embodiments are possible, within the scope of the claims.

In some embodiments, the filter is set to high bandwidth during $T_{down}$. In some embodiments, the filter is set to high bandwidth during idle times.

In some embodiments, an ADC samples signals originating from the receiver throughout periods corresponding to the FMCW synthesizer generating a FMCW chirp.

In some embodiments, the input of the frequency divider connected to the output of the buffer is also referred to as a tone input, and the input of the frequency divider connected to the digital ramp generator is also referred to as a control input.

In some embodiments, in the phase locked loop, a control voltage generator can be used to generate a control voltage (VCTRL) for the VCO in response to the reference frequency and to feedback responsive to the VCO output signal. In some embodiments, the control voltage generator includes the PFD, charge pump, and filter as described with respect to FIG. 3.

In some embodiments, a FMCW chirp corresponds to a decreasing frequency, and ramp-down corresponds to an increasing frequency.

In some embodiments, during an initial portion of a FMCW chirp, such as the first 10% of the FMCW chirp, the FMCW synthesizer continues to settle towards an accurate frequency ramp. This time can be considered "wasted" time, during which the ADC is not sampling data for analysis.

In some embodiments, a time between FMCW chirps (an idle time) can be called an inter-chirp time.

In some embodiments, ramp-down occurs prior to a FMCW chirp, producing a signal similar to a reverse sawtooth. Accordingly, starting at an idle frequency, the frequency changes with a specified slope for a specified duration to reach a FMCW chirp-start frequency, while the current of the charge pump output and the bandwidth of the filter are relatively increased. Then starting at the FMCW chirp-start frequency, the frequency changes with a specified slope for a specified duration to produce a FMCW chirp, while the current of the charge pump output and the bandwidth of the filter are relatively decreased.

In some embodiments of a 76-81 GHz commercial automotive radar, durations of an idle time, a FMCW chirp, and a ramp-down period are 5 µs, 30 µs, and 2 µs, respectively. In some embodiments, a FMCW chirp duration is 15 µs to facilitate accurate detection of presence, range, and velocity of objects with very high velocities.

In some embodiments, a processor (for example, a DSP) processes data sampled (for example, by an ADC) during the FMCW chirp to determine one or more of presence, distance, or velocity of target objects. In some embodiments, the processor does not process data sampled during ramp down or during idle time (or both) to determine presence, distance, or velocity of target objects.

In certain embodiments, with respect to FIGS. 2 through 6, a frequency of an output signal is controlled to have (for example) a particular value between a first time and a second time, and a particular slope starting at the particular value between the second time and a third time, are intended to suggest that the frequency of the output signal avoids other, unintended values or slopes during the described time periods. However, in certain embodiments, real signal frequencies may not exhibit perfectly linear behavior, and that ordinary frequency variations common to smooth transitions in controlled characteristics of signals (as opposed to, for example, disjoint frequency control leading to overshoots, as described herein) are intended to be contemplated within described signal performance with respect to specified behaviors during specified intervals.

What is claimed is:

1. A frequency modulated continuous wave (FMCW) synthesizer, comprising:
   a phase locked loop (PLL) including:
      a frequency divider including a control input, a frequency divider input, and a frequency divider output;
      a control voltage generator (CVG) including a CVG input coupled to the frequency divider output, wherein the CVG is configured to generate a control voltage in response to the CVG input; and
      a voltage controlled oscillator (VCO) including a VCO input coupled to the CVG, wherein the VCO further includes a VCO output coupled to the frequency divider input, and wherein the VCO is configured to output a FMCW output signal having a FMCW output frequency in response to the VCO input; and a control engine including a control output coupled to the control input of the frequency divider, the control engine configured to control the PLL so that the FMCW output frequency:

from a first time to a second time, is a first idle frequency;

from the second time to a third time, changes at a specified first rate;

from the third time to a fourth time, changes at a specified second rate, wherein the specified first rate is different from the specified second rate; and from the fourth time to a fifth time, is a second idle frequency, wherein the first idle frequency is different from the second idle frequency.

2. The FMCW synthesizer of claim 1, further comprising:

a receiver adapted to receive a reflected FMCW chirp, the receiver including a receiver output;

an analog to digital converter (ADC) including an ADC input and an ADC output, the ADC input coupled to the receiver output, the ADC configured to sample signals received by the ADC input and to output the sampled signals;

a processor including a processor input coupled to the ADC output, the processor configured to, in response to the sampled signals sampled between the second time and the third time, determine at least one of presence, distance, or velocity of target objects, and configured not to perform a determined action between the third time and the fourth time; and a transmitter including a transmitter input and configured to transmit signals received by the transmitter input, the transmitter input coupled to the VCO output.

3. The FMCW synthesizer of claim 2, wherein an absolute value of the specified second rate is greater than an absolute value of the specified first rate.

4. The FMCW synthesizer of claim 1, wherein the control output is a first control output of the control engine;

wherein the control engine includes a second control output and a third control output;

wherein the CVG includes:

a charge pump (CP) including a CP control input and a CP output, the CP control input coupled to the second control output, wherein a current of the CP output is configured to change in response to the CP control input; and a filter that includes a filter signal input, a filter control input, and a filter output, the filter signal input coupled to the CP output, and the filter control input coupled to the third control output, wherein a bandwidth of the filter is configured to change in response to the filter control input.

5. The FMCW synthesizer of claim 4, wherein the control engine is configured to control the bandwidth of the filter to be relatively lower between the second time and the third time; and wherein the control engine is configured to control the bandwidth of the filter to be wherein the control engine is configured to control the bandwidth of the filter to be relatively higher between the third time and the fourth time.

6. The FMCW synthesizer of claim 5, wherein the filter is configured to change the bandwidth of the filter by changing one or more impedances of the filter.

7. The FMCW synthesizer of claim 4, wherein the control engine is configured to control the current of the CP output to be relatively lower between the second time and the third time; and wherein the control engine is configured to control the current of the CP output to be wherein the control engine is configured to control the current of the CP output to be relatively higher between the third time and the fourth time.

8. The FMCW synthesizer of claim 1, wherein the specified first rate is a constant and the specified second rate is a constant.

9. The FMCW synthesizer of claim 1, wherein the control output is a first control output of the control engine;

wherein the control engine includes a second control output;

wherein the CVG includes a CVG control input coupled to the second control output; and wherein the CVG is configured to change a current of the control voltage output in response to the CVG control input;

wherein the control engine is configured to control the current of a control voltage output to be relatively lower between the second time and the third time; and wherein the control engine is configured to control the current of the control voltage output to be relatively higher between the third time and the fourth time.

10. The FMCW synthesizer of claim 1, wherein the control engine is configured to control the PLL so that the FMCW output frequency:

from the fifth time to a sixth time or vice versa, changes at a specified third rate;

from the sixth time to a seventh time or vice versa, changes at a specified fourth rate, wherein the specified third rate is different from the specified fourth rate; and from the seventh time to an eighth time or vice versa, is a third idle frequency.

11. The FMCW synthesizer of claim 1, wherein the control engine is configured to control the PLL to maintain phase lock both when generating FCMW chirps and during idle times between generation of FMCW chirps.

12. The FMCW synthesizer of claim 1, wherein a time order either starts with the first time, then continues to the second time, then the third time, then the fourth time, then the fifth time, or starts with the fifth time, then continues to the fourth time, then the third time, then the second time, then the first time.

13. The FMCW synthesizer of claim 1, wherein the control engine includes a feedback input, the frequency divider output is coupled to the feedback input, and the control engine controls the PLL in response to the feedback input.

14. A frequency modulated continuous wave (FMCW) radar system, comprising:

a receiver adapted to receive a reflected FMCW chirp, the receiver including a receiver output;

a FMCW synthesizer including:

a FMCW synthesizer output;

a phase locked loop (PLL) including a control input and a PLL output coupled to the FMCW synthesizer output, and configured to output a FMCW signal with a FMCW output frequency in response to the control input; and a control engine including a feedback input and a control output, the feedback input coupled to the FMCW synthesizer output, the control output coupled to the control input, the control engine configured to control the PLL in response to the feedback input so that the FMCW output frequency:
  from a first time to a second time, is a first FMCW idle frequency;
  from the second time to a third time, changes at a specified first rate;
  from the third time to a fourth time, changes at a specified second rate, wherein the specified first rate is different from the specified second rate, the second specified rate being different from the specified first rate; and
  from the fourth time to a fifth time, is a second FMCW idle frequency, which is different from the first FMCW idle frequency;
a mixer including a first mixer input, a second mixer input, and a mixer output, the first mixer input coupled to the receiver output, the second mixer input coupled to the FMCW synthesizer output, the mixer configured to generate mixer output signals in response to the first mixer input and the second mixer input;
an analog to digital converter (ADC) including an ADC input and an ADC output, the ADC input coupled to the mixer output, the ADC configured to sample signals received by the ADC input and to output the sampled signals;
a processor including a processor input coupled to the ADC output, the processor configured to, in response to the sampled signals sampled between the second time and the third time, determine at least one of presence, distance, or velocity of target objects, and configured not to perform a determined action between the third time and the fourth time; and
a transmitter including a transmitter input and configured to transmit signals received by the transmitter input, the transmitter input coupled to the FMCW synthesizer output.

15. The FMCW radar system of claim 14, wherein an absolute value of the specified second rate is greater than an absolute value of the specified first rate.

16. The FMCW radar system of claim 14, wherein the control engine is configured to control the PLL to maintain phase lock both when generating FCMW chirps and during idle times between generation of FMCW chirps.

17. The FMCW radar system of claim 14, wherein the control engine is configured to control the PLL to:
  increase a filter bandwidth of a filter of the PLL during idle times between generation of FMCW chirps;
  lower the filter bandwidth of the filter of the PLL during generation of FMCW chirps;
  increase a current of a control voltage of a voltage controlled oscillator (VCO) of the PLL during the idle times between generation of FMCW chirps; and
  lower the current of the control voltage of the VCO of the PLL during generation of the FMCW chirps.

18. A method for operating a frequency modulated continuous wave (FMCW) radar, comprising:
  receiving, by a receiver, a FMCW chirp reflection signal;
  generating, using a FMCW synthesizer, a FMCW synthesizer signal at a FMCW synthesizer output frequency, wherein the FMCW synthesizer output frequency:
    from a first time to a second time, is a first FMCW idle frequency;
    from the second time to a third time, changes at a specified first rate;
    from the third time to a fourth time, changes at a specified second rate, wherein the specified first rate is different from the specified second rate; and
    from the fourth time to a fifth time, is a second FMCW idle frequency, which is different from the first FMCW idle frequency;
  mixing, using a mixer, the FMCW chirp reflection signal and the FMCW synthesizer signal, to generate a mixer output;
  sampling the mixer output using an analog-to-digital converter (ADC); and
  transmitting, using a transmitter, the FMCW synthesizer signal.

19. The method of claim 18, further comprising:
  lowering a bandwidth of a filter of a phase locked loop (PLL) of the FMCW synthesizer to be relatively lower between the second time and the third time; and
  raising the bandwidth of the filter of the PLL of the FMCW synthesizer to be relatively higher between the third time and the fourth time.

20. The method of claim 18, further comprising:
  lowering a current of an output of a charge pump of a phase locked loop (PLL) of the FMCW synthesizer to be relatively lower between the second time and the third time; and
  raising a current of the output of the charge pump of the PLL of the FMCW synthesizer to be relatively higher between the third time and the fourth time.

21. The method of claim 18,
  further comprising generating, using the FMCW synthesizer, the FMCW synthesizer signal, wherein the FMCW synthesizer output frequency:
    between the fifth time and a sixth time, changes at a specified third rate;
    between the sixth time and a seventh time, changes at a specified fourth rate, wherein the specified third rate is different from the specified fourth rate; and
    between the seventh time and an eighth time, is a third FMCW idle frequency.

22. The method of claim 18, further comprising maintaining phase lock, using a phase locked loop (PLL) of the FMCW synthesizer, both when generating FCMW chirps and during idle times between generation of FMCW chirps.

23. The method of claim 18, wherein a time order either starts with the first time, then continues to the second time, then the third time, then the fourth time, then the fifth time, or starts with the fifth time, then continues to the fourth time, then the third time, then the second time, then the first time.

* * * * *